(12) United States Patent
Brick et al.

(10) Patent No.: US 8,668,365 B2
(45) Date of Patent: Mar. 11, 2014

(54) OPTOELECTRONIC DEVICE

(75) Inventors: Peter Brick, Regensburg (DE); Sven Weber-Rabsilber, Neutraubling (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 99 days.

(21) Appl. No.: 13/119,342

(22) PCT Filed: Sep. 1, 2009

(86) PCT No.: PCT/DE2009/001228
§ 371 (c)(1),
(2), (4) Date: Mar. 31, 2011

(87) PCT Pub. No.: WO2010/034281
PCT Pub. Date: Apr. 1, 2010

(65) Prior Publication Data
US 2011/0182075 A1    Jul. 28, 2011

(30) Foreign Application Priority Data

Sep. 25, 2008   (DE) .......................... 10 2008 048 846

(51) Int. Cl.
*F21V 7/00*   (2006.01)
*F21S 8/00*   (2006.01)

(52) U.S. Cl.
USPC ..................................... 362/296.01; 362/257

(58) Field of Classification Search
USPC ............................. 362/296.01, 297–301, 310
See application file for complete search history.

(56) References Cited

U.S. PATENT DOCUMENTS

| | | | |
|---|---|---|---|
| 4,271,408 A | 6/1981 | Teshima et al. | |
| 5,939,996 A | 8/1999 | Kniveton et al. | |
| 6,886,962 B2 | 5/2005 | Suehiro | |
| 2002/0017844 A1 | 2/2002 | Parkyn et al. | |
| 2006/0138440 A1 | 6/2006 | Jyo | |
| 2006/0175626 A1 | 8/2006 | Wall, Jr. | |
| 2007/0086148 A1 | 4/2007 | Schwenkschuster et al. | |

FOREIGN PATENT DOCUMENTS

| | | |
|---|---|---|
| CN | 101048879 | 10/2007 |
| DE | 29 41 634 A1 | 4/1980 |
| DE | 94 17 326.5 | 12/1994 |
| DE | 697 28 318 T2 | 8/2004 |
| DE | 10 2005 001 954 A1 | 9/2005 |
| DE | 10 2005 059 524 A1 | 4/2007 |
| DE | 601 25 732 T2 | 10/2007 |
| EP | 1 418 629 B1 | 1/2008 |
| FR | 2 712 108 A3 | 5/1995 |
| JP | 2000-299502 A | 10/2000 |
| WO | 04/001285 A2 | 12/2003 |
| WO | 2004/068447 A1 | 8/2004 |
| WO | 2007/058955 A2 | 5/2007 |

*Primary Examiner* — Anh Mai
*Assistant Examiner* — Brenitra M Lee
(74) *Attorney, Agent, or Firm* — DLA Piper LLP (US)

(57) ABSTRACT

An optoelectronic device includes at least one luminescence diode chip which emits electromagnetic radiation during operation of the optoelectronic device, and at least one shield against stray radiation which laterally surrounds the luminescence diode chip only in places, wherein each shield is integral with a component of the optoelectronic device.

15 Claims, 7 Drawing Sheets

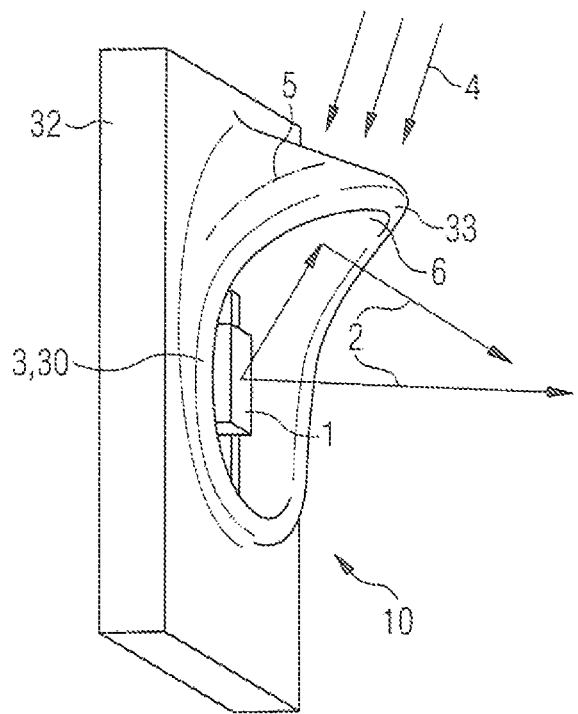
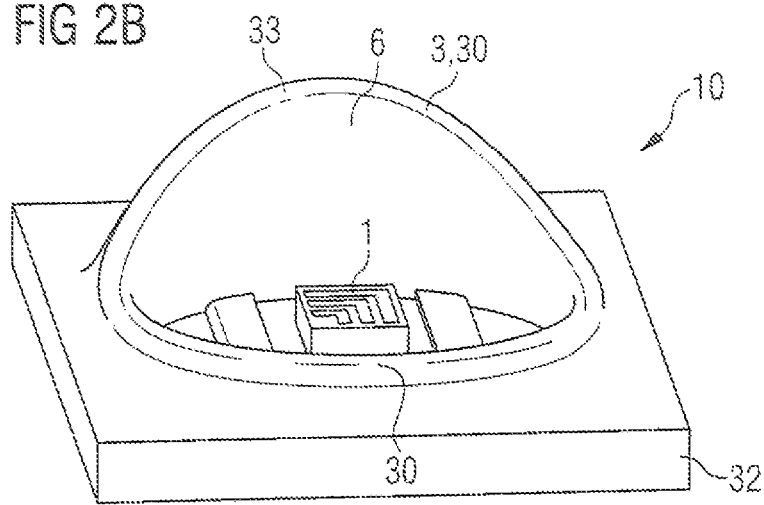

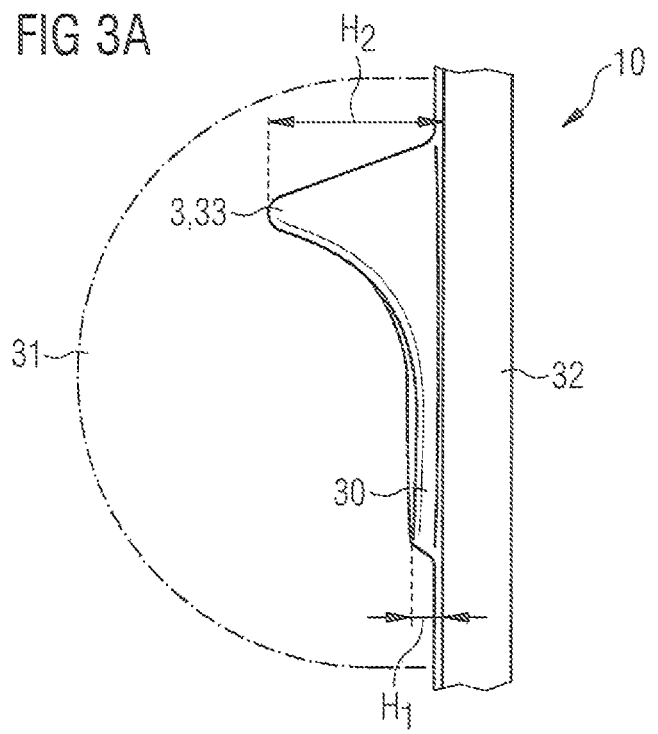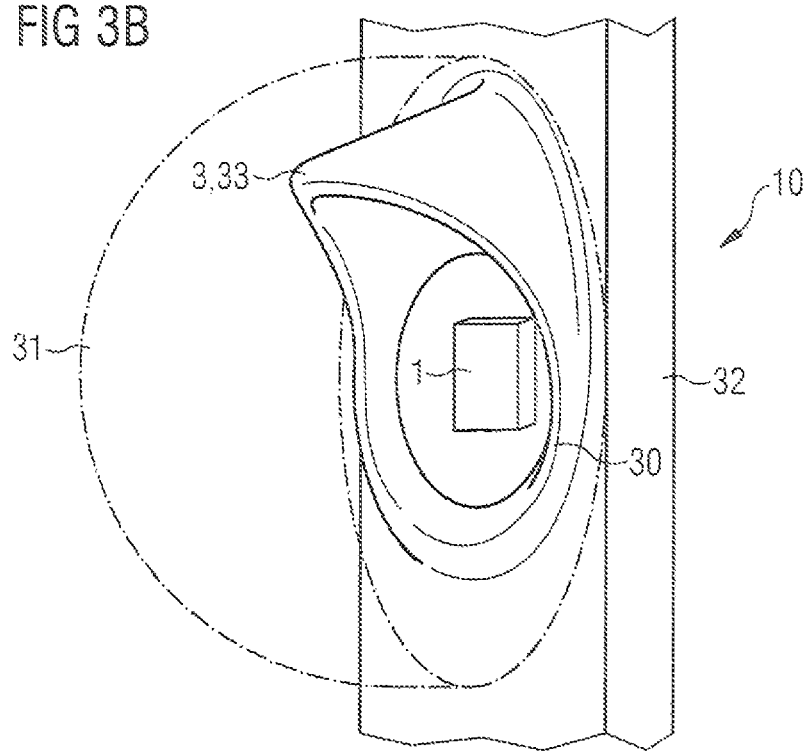

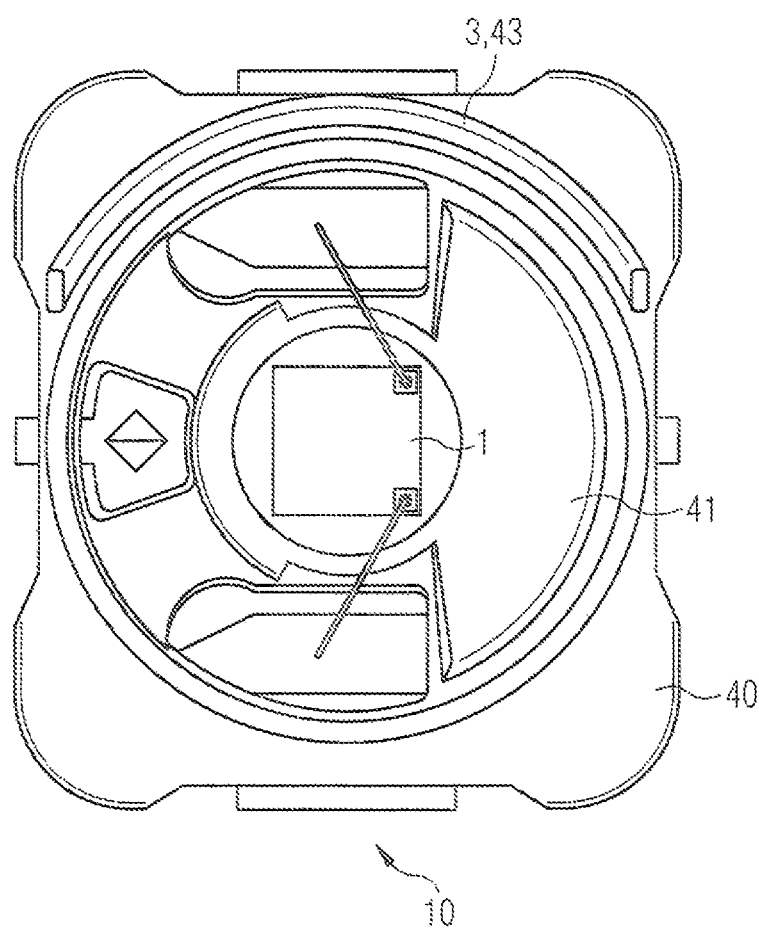

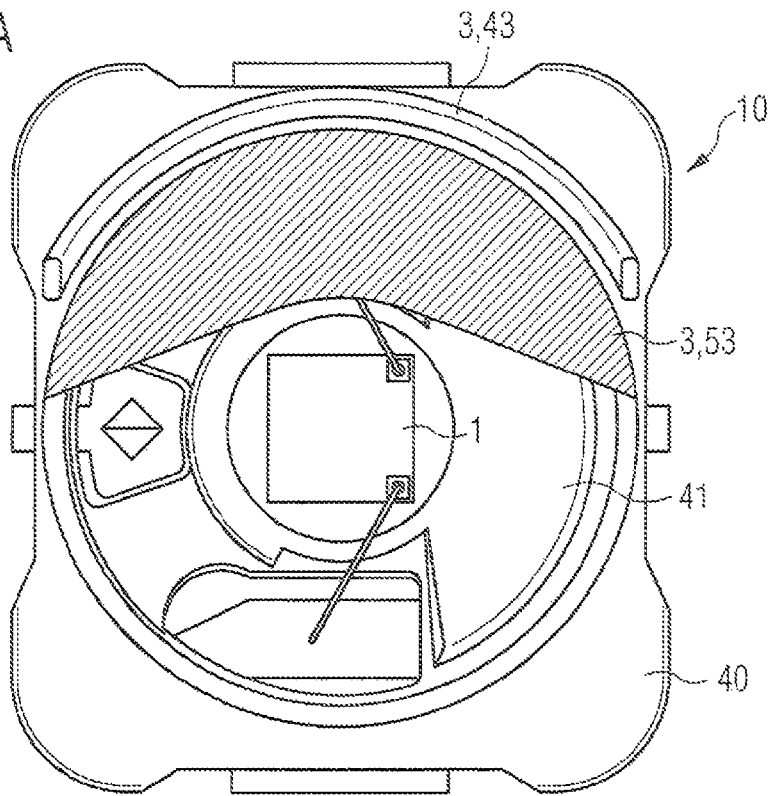
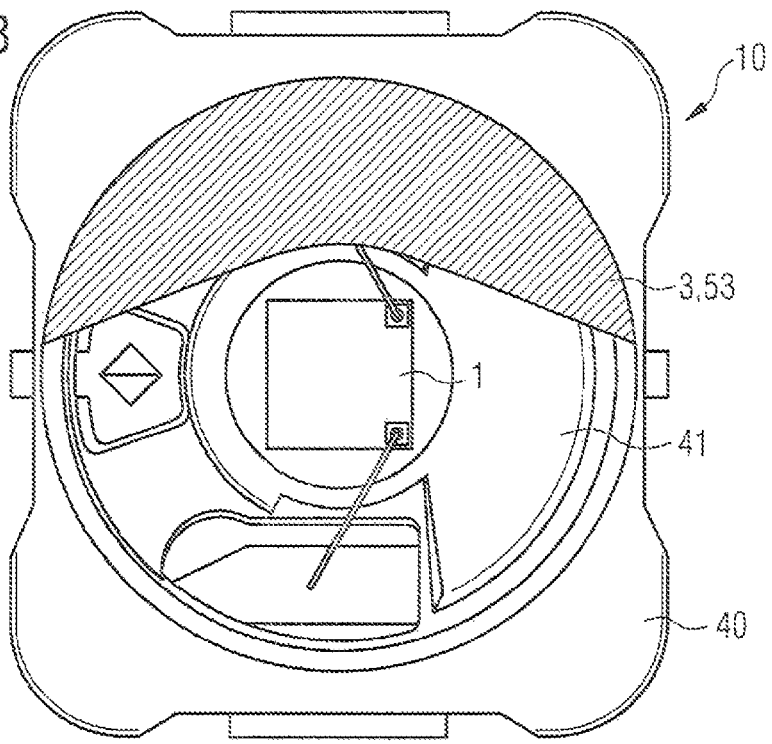

OPTOELECTRONIC DEVICE

RELATED APPLICATIONS

This is a §371 of International Application No. PCT/DE2009/001228, with an international filing date of Sep. 1, 2009 (WO 2010/034281 A1, published Apr. 1, 2010), which is based on German Patent Application No. 10 2008 048 846.1, filed Sep. 25, 2008, the subject matter of which is incorporated by reference.

TECHNICAL FIELD

This disclosure relates to optoelectronic devices.

BACKGROUND

Optoelectronic devices are known. DE 10 2005 001 954 A1 describes one such optoelectronic device.

However, it could be helpful to provide an optoelectronic device which is protected particularly well against environmental influences such as incidence of stray light and/or rainwater. It could further be helpful to provide an optoelectronic device which can be mounted in a particularly simple manner.

SUMMARY

We provide an optoelectronic device including at least one luminescence diode chip which emits electromagnetic radiation during operation of the optoelectronic device, and at least one shield against stray radiation which laterally surrounds the luminescence diode chip only in places, wherein each shield is integral with a component of the optoelectronic device.

BRIEF DESCRIPTION OF THE DRAWINGS

FIGS. 1A to 5B show various examples of optoelectronic devices in schematic perspective illustrations.

DETAILED DESCRIPTION

Figure 1A:
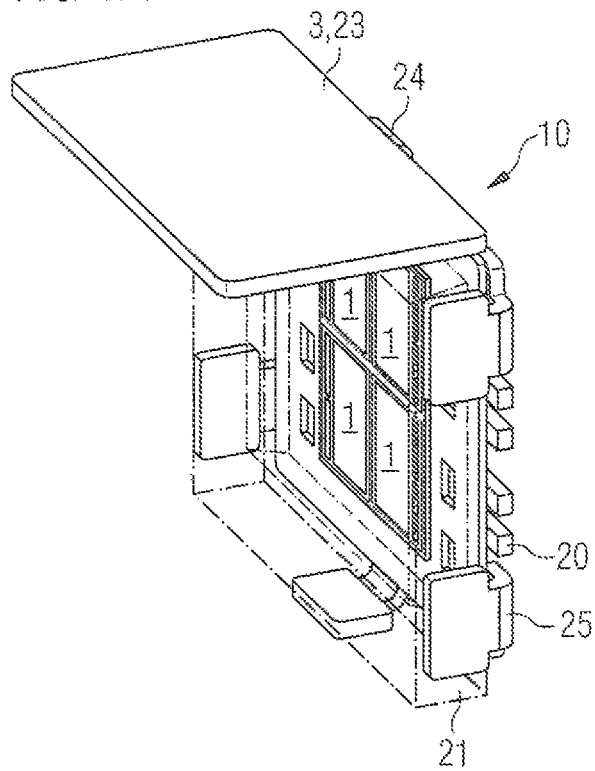

Our device comprises at least one luminescence diode chip. The luminescence diode chip is preferably a laser diode chip or a light-emitting diode chip. During operation of the optoelectronic device, the luminescence diode chip is suitable for generating electromagnetic radiation. In this case, the electromagnetic radiation can lie in the wavelength range from UV radiation to infrared light. By way of example, the luminescence diode chip is suitable for generating electromagnetic radiation in the visible spectral range.

The device comprises at least one shield against stray radiation. Stray radiation is radiation which impinges on the device from outside, that is to say, from outside the optoelectronic device. By way of example, this concerns sunlight or the light from luminous means such as floodlights, for example. The stray radiation, if it is not shielded, can impinge on the luminescence diode chip or some other component of the optoelectronic device such as a lens, for example, and be reflected there. Electromagnetic radiation emitted by the optoelectronic device during operation is thereby corrupted. In this case, the undesirable electromagnetic radiation is also referred to as phantom radiation.

The shield is suitable, then, for keeping the stray radiation away from the luminescence diode chip and/or other components of the optoelectronic device. Preferably, the shield laterally surrounds the luminescence diode chip only in places. That is to say that, the shield is arranged in a manner laterally adjacent to, preferably laterally spaced apart from, the luminescence diode chip, wherein the shield does not completely surround the luminescence diode chip laterally, rather the shield surrounds the luminescence diode chip only at selected places, for example, along a single side area.

In this case, the shield is arranged in such a way that it can shield the luminescence diode chip and/or further optical components of the optoelectronic device against stray radiation from an external radiation source. If the shield is provided as a shield against sunlight, for example, then the shield surrounds the luminescence diode chip preferably at sides of the luminescence diode chip which face the sun. The shield casts a shadow, in which the components to be shielded are at least partly or completely situated.

The shield may be embodied integrally with at least one component of the optoelectronic device. That is to say that, the shield is formed together with a further component of the optoelectronic device as one piece. The shield forms a part or a region of the component. In this case, "integrally" can also mean, in particular, that no interface is arranged between the shield and the component. The shield and the component can be produced jointly, for example.

It is also possible, in particular, for the shield to be embodied integrally with a plurality of components of the optoelectronic device. In this case, the optoelectronic device comprises a plurality of shields, wherein each shield is embodied integrally with a component of the optoelectronic device. That is to say that, the optoelectronic device can comprise one, two or more shields, wherein each shield is embodied integrally with a different component of the optoelectronic device.

The device may comprise at least one luminescence diode chip which emits electromagnetic radiation during the operation of the optoelectronic device. Furthermore, the optoelectronic device comprises at least one shield against stray radiation which laterally surrounds the luminescence diode chip only in places. In this case, each of the shields is embodied integrally with a component of the optoelectronic device. The components can be, for example, connection carriers, circuit boards, optical elements such as lenses, housing base bodies, and/or reflector walls.

In this case, the optoelectronic device described is based on the insight, inter alia, that a shield which is embodied integrally with a component of the device reduces the mounting complexity of the optoelectronic device. This is because it is no longer necessary to adjust optoelectronic device and shield separately from one another. Furthermore, the integral example of the shield with a component of the optoelectronic device increases the mechanical stability of the optoelectronic device since a shield fixed separately to the optoelectronic device or in the vicinity of the optoelectronic device can be separated from the optoelectronic device, for example, on account of external weathering influences, more easily than a shield embodied integrally with a component of the device.

The optoelectronic device may comprise a connection carrier. The connection carrier is, for example, a circuit board having electrical connection locations for electrically connecting the at least one luminescence diode chip. Furthermore, the circuit board has conductor tracks through which electrical contact can be made with the at least one luminescence diode chip. In this case, the circuit board can comprise an electrically insulating base body, for example, into which or onto which the electrical connection locations and the conductor tracks are structured.

Furthermore, it is possible for the connection carrier to be a leadframe. Such a leadframe also serves for fixing and making electrical contact with the at least one luminescence diode chip.

The at least one luminescence diode chip is fixed on the connection carrier at least indirectly.

In this case, at least indirectly means that the luminescence diode chip can be applied directly to the connection carrier. Furthermore, it is possible for further components to be situated between luminescence diode chip and connection carrier.

In this case, electrical contact is made with the at least one luminescence diode chip by the connection carrier. That is to say that, the at least one luminescence diode chip can be energized by the connection carrier during the operation of the optoelectronic device.

The at least one shield may be formed by a shielding region of the connection carrier at least in places. The shield is therefore embodied integrally with the connection carrier, and thus with a component of the optoelectronic device.

That means that the connection carrier has at least two partial regions: a shielding region, which forms at least one shield of the optoelectronic device against stray radiation. In this case, the shielding region is arranged in such a way that it laterally surrounds the luminescence diode chip only in places. In this case, by way of example, the shielding region of the connection carrier is free of a luminescence diode chip.

Furthermore, the connection carrier comprises a remaining region, on which, by way of example, the at least one luminescence diode chip is arranged.

The device may comprise a connection carrier, on which the at least one luminescence diode chip is fixed at least indirectly and via which electrical contact is made with the at least one luminescence diode chip. In this case, at least one shield of the optoelectronic device is formed by a shielding region of the connection carrier.

The connection carrier may have a bend. The bend connects the shielding region of the connection carrier to the rest of the connection carrier, on which, by way of example, the at least one luminescence diode chip is fixed at least indirectly. In this case, the connection carrier preferably consists of a flexible material.

Furthermore, it is possible for an articulation or a hinge to be provided in the connection carrier. At all events, the connection carrier has a bend, such that the shielding region is arranged at a specific angle with respect to the connection carrier. Preferably, the shielding region and the rest of the connection carriers are arranged at an angle of less than or equal to 110° C. with respect to one another.

In other words, the shielding region and the rest of the connection carrier form an angle of less than or equal to 110° with one another. Preferably, the connection carrier is in this case embodied in flexible fashion in such a way that the user of the optoelectronic device, for example, after the mounting of the optoelectronic device, can set the angle between the shielding region and the rest of the connection carrier in a specific range. In this way, it is possible for the shield to be optimally adapted to the location of use of the optoelectronic device.

Depending on the mounting location of the optoelectronic device, an optimum shielding against sunlight, for example, can be effected by way of the setting of the angle.

The device may comprise a reflector wall, which laterally completely surrounds the at least one luminescence diode chip. The reflector wall is suitable for reflecting electromagnetic radiation generated by the luminescence diode chip during operation. Preferably, the reflector wall has a reflectivity of at least 90%, preferably of at least 95%, for the electromagnetic radiation generated by the luminescence diode chip during operation.

For this purpose, the reflector wall can be formed from a white ceramic material or with a metal. The reflector wall laterally completely surrounds the at least one luminescence diode chip, that is to say, that it is arranged around the luminescence diode chip in a frame-like manner. In this case, the expression "in a frame-like manner" does not relate to the geometry of the reflector wall, however, but rather is merely intended to express the fact that the luminescence diode chip is laterally completely enclosed by the reflector wall.

The reflector wall may have a non-uniform height. That is to say, that the reflector wall has regions in which it is higher than in other regions. In a circulation around the at least one light-emitting diode chip, in this case, by way of example, the height of the reflector wall firstly increases, reaches a maximum height, and decreases until it reaches a minimum height.

At least one shield of the device against stray radiation may be formed by a shielding region of the reflector wall at least in places. In this case, the shield is embodied integrally with the reflector wall, that is to say, a component of the optoelectronic device, by the shielding region.

The shielding region of the reflector wall is embodied in a manner higher than the rest of the reflector wall. That is to say that, in a circulation around the at least one luminescence diode chip, the reflector wall has a region in which the height increases, reaches a maximum and decreases to the initial value of the height.

The shielding region is then formed by that region of the reflector wall in which the height increases, reaches a maximum and falls to the initial value. Those regions of the reflector wall which are embodied in a manner higher than the minimum height of the reflector wall then form the shielding region.

The device may comprise a reflector wall, which laterally completely surrounds the at least one luminescence diode chip, wherein the reflector wall has a non-uniform height. In this case, at least one shield of the optoelectronic device against stray radiation is formed, at least in places, by a shielding region of the reflector wall, the shielding region being embodied in a manner higher than the rest of the reflector wall.

The reflector wall may be arranged within a lens for the at least one luminescence diode chip. The lens can span the reflector wall and the at least one luminescence diode chip in the manner of a dome. Within the lens, the reflector wall and luminescence diode chip can then adjoin a gas, for example, air. Furthermore it is possible for the lens to be embodied as a solid body which is applied to the luminescence diode chip and the reflector wall in the manner of a potting.

In other words, the reflector wall and the at least one luminescence diode chip are embedded into the material of the lens that is to say a potting. In this case, it is also possible for the potting not to be shaped in a lens-like fashion, but rather to have planar side areas and a planar cover area. At all events, the reflector wall directly adjoins a potting for the at least one luminescence diode chip at least in places.

On the one hand, the reflector wall and, thus, the shield formed by a shielding region of the reflector wall are protected particularly well against external influences by the potting. The shielding region is therefore protected against external weathering influences and also against mechanical loading.

On the other hand, the disadvantage can arise that the shield does not constitute protection against stray radiation for the entire potting. In this case, therefore, the potting itself has to be protected in a particularly resistant manner against the stray radiation, for example, against UV radiation and against external influences such as rainwater, for example. For this purpose, the optoelectronic device can comprise a further shield formed by the shielding region of a connection carrier. Furthermore, particularly UV-resistant materials such as silicone, for example, can be used for the potting.

The device may have an absorber wall instead of the reflector wall, which absorber wall absorbs electromagnetic radiation impinging on it. Otherwise, the absorber wall is embodied like the reflector wall described. The absorber wall is embodied in a black fashion, for example. It can be coated in a black fashion—for example, with a colorant—or be formed from a black material—such as carbon black-filled plastic.

The absorber wall suppresses the arising of scattered radiation, for example. For this purpose, the absorber wall has a reflectivity of preferably less than 10%, particularly preferably less than 5%, for light impinging on it.

The reflector wall or the absorber wall may be embodied integrally with a carrier of the device. By way of example, the reflector wall or the absorber wall and the carrier are produced by a joint injection-molding method or a joint transfer-molding method with one another. That is to say, that the reflector wall or the absorber wall and the carrier are jointly injection-molded or transfer-molded. This is a feature related to a product which can be detected on the finished device.

The optoelectronic device may comprise a housing base body. The housing base body is produced from a plastics material, for example.

The housing base body can have a cavity, in which the at least one luminescence diode chip is arranged. The luminescence diode chip is then surrounded in the cavity laterally by a housing wall of the housing base body, which wall can be embodied as a reflector wall. This reflector wall has a uniform height. However, it is also possible for the reflector wall, as described further above, to have a non-uniform height and thereby to form one of the shields of the optoelectronic device against stray radiation.

At least one shield of the device may be formed by a shielding region of the housing base body at least in places. That is to say, that a shielding region of the housing base body is formed integrally with the housing base body and, thus, integrally with a component of the optoelectronic device, in which shielding region the housing base body is embodied in the manner of a projection, for example. The projection surrounds the luminescence diode chip laterally only in places.

The device may comprise a housing base body having a cavity, in which the at least one luminescence diode chip is arranged. In this case, at least one shield of the optoelectronic device against stray radiation is formed by a shielding region of the housing base body at least in places.

The shielding region of the housing base body can be arranged within or outside a lens and/or a potting for the at least one luminescence diode chip. At all events, the shielding region can be produced jointly with the housing base body in a particularly simple manner by means of transfer molding or injection molding, for example. That is to say that, the shielding region may be embodied in a manner injection molded or transfer molded together with the rest of the housing base body. In this case, "injection molded" or "transfer molded" constitute features related to products which can be detected on the finished product. That it to say, that on the finished product it can be detected that the shielding region was embodied integrally with the housing base body by injection molding or transfer molding.

The housing base body can be cast or molded in places, for example, around a connection carrier on which the at least one luminescence diode chip is fixed at least indirectly.

The optoelectronic device may comprise a lens for the at least one luminescence diode chip. The lens is an optical element which, for example, increases the probability of coupling-out of electromagnetic radiation from the optoelectronic device. Furthermore, the lens can have beam-checking properties. The lens can have a focusing or scattering effect, for example, for the electromagnetic radiation passing through.

At least one shield of the optoelectronic device against stray radiation may be formed by a shielding region of the lens at least in places. That is to say, that the lens comprises at specific places a shielding region formed by a structuring, a coating or a partial coloration of the lens. By way of example, the lens can be embodied in polarizing, absorbent and/or reflective fashion in the shielding region. This can be realized, for example, by a partial coating of the outer surface of the lens which is remote from the at least one luminescence diode chip with a metal.

The device may comprise a lens for the at least one luminescence diode chip, wherein at least one shield of the optoelectronic device is formed by a shielding region of the lens.

At least one of the shields of the optoelectronic device may have at least one reflection region which faces the at least one luminescence diode chip and is embodied as reflective to electromagnetic radiation generated by the luminescence diode chip during the operation of the optoelectronic device.

That is to say, that radiation generated by the luminescence diode chip can partly impinge, during the operation of the optoelectronic device, on the reflection region of the shield and is reflected there. In this case, the reflectance is preferably at least 90%, particularly preferably at least 95%.

The remaining regions of the shield, in particular those regions on which the stray radiation impinges, are preferably configured as radiation-absorbing. That is to say, that they absorb the incident stray radiation, such that no scattered light which could disturb the optical impression of the optoelectronic device arises at the shield. At all events, the shield is embodied as radiation-opaque to the stray radiation, such that no stray radiation can impinge through the shield on regions of the optoelectronic device that are to be shielded.

The shield at least in a absorption region facing the at least one luminescence diode chip may be embodied as absorbent to electromagnetic radiation generated by the luminescence diode chip during the operation of the optoelectronic device. That is to say that, in these absorption regions, no reflection or hardly any reflection of the impinging electromagnetic radiation of the luminescence diode chip takes place, rather the radiation is absorbed in the absorption region. In this case, the absorptance is preferably at least 90%, particularly preferably at least 95%.

The shield can be embodied as reflective or absorbent in the entire region facing the at least one luminescence diode chip. Furthermore, it is possible for the shield to have there reflection regions embodied in a reflective fashion and absorption regions embodied in an absorbent fashion.

At least one of the shields may have a curvature. In this case, "curvature" means that the shield is led in places laterally around the at least one luminescence diode chip in the manner of an arc, a sphere segment, a spherical shell segment, a hollow cylinder segment or similar geometrical figures. Such a structure of the shield can prove to be advantageous in two ways.

First, such a shield, if it is embodied as absorbent and/or reflective in its region facing the luminescence diode chip, can undertake optical tasks in the optoelectronic device. That is to say, that the shield with curvature can contribute to the setting of a defined emitting characteristic of the optoelectronic device.

Second, the curvature can be suitable for guiding moisture, in particular rainwater impinging on the optoelectronic device from outside, around the radiation exit area of the optoelectronic device.

In this case, the radiation exit area of the optoelectronic device is that possibly conceived area of the device through which the electromagnetic radiation generated during operation passes toward the outside. The radiation exit area can be formed, for example, by the part of the outer surface of a lens or of a potting. The curvature of the shield can be suitable for guiding rainwater around the radiation exit area, particularly if the shield is embodied outside a lens or a potting or integrated with a lens or a potting.

The optoelectronic device described can have exactly one of the shields described. Furthermore, it is possible for the optoelectronic device described to have a combination of two or more of the shields described.

Thus, the optoelectronic device can have, for example, a shield formed by a shielding region of a connection carrier. In addition, the optoelectronic device can then have a shield formed by the shielding region of a reflector wall. Furthermore, a lens for the at least one luminescence diode chip of the optoelectronic device can have a shielding region. The combination of two or more shields makes it possible to specify an optoelectronic device that is protected particularly well against stray radiation.

The optoelectronic device described is particularly well suited, for example, to the formation of a large-screen display wherein individual pixels are formed by an optoelectronic device described. That is to say, that the display is formed by a multiplicity of optoelectronic devices arranged in a matrix-like manner. In this case, each of the devices has at least one shield which protects it against incidence of stray light, for example, against sunlight. Furthermore, the shield of each optoelectronic device can form a protection of the radiation exit area of the device against rainwater. In this way, the display can be operated even under poor weather conditions. As a result of rainwater being diverted by a shield of the optoelectronic device, water is not deposited on the radiation exit area of the device, with the result that scattered light on account of drops of water acting like undesirable optical elements is prevented.

The optoelectronic device described is explained in greater detail below on the basis of examples and the associated figures.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size to enable better illustration and/or to afford a better understanding.

Figure 1B:
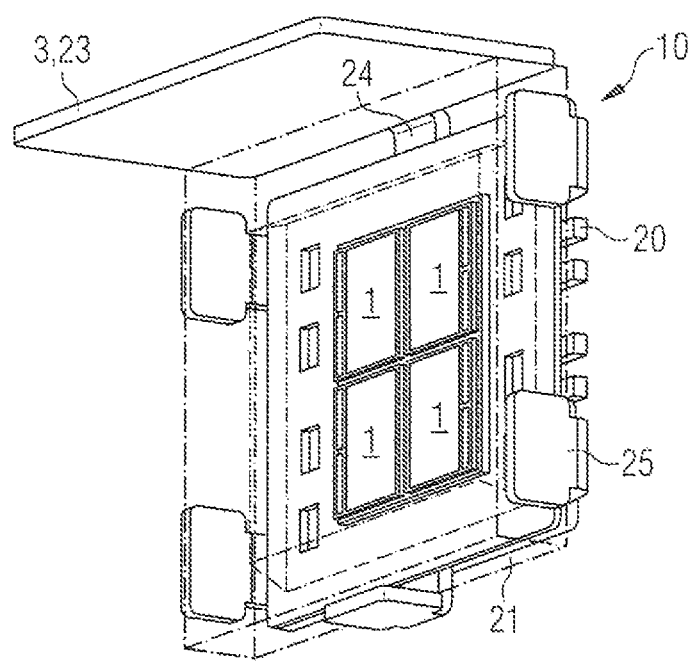
Figure 1C:
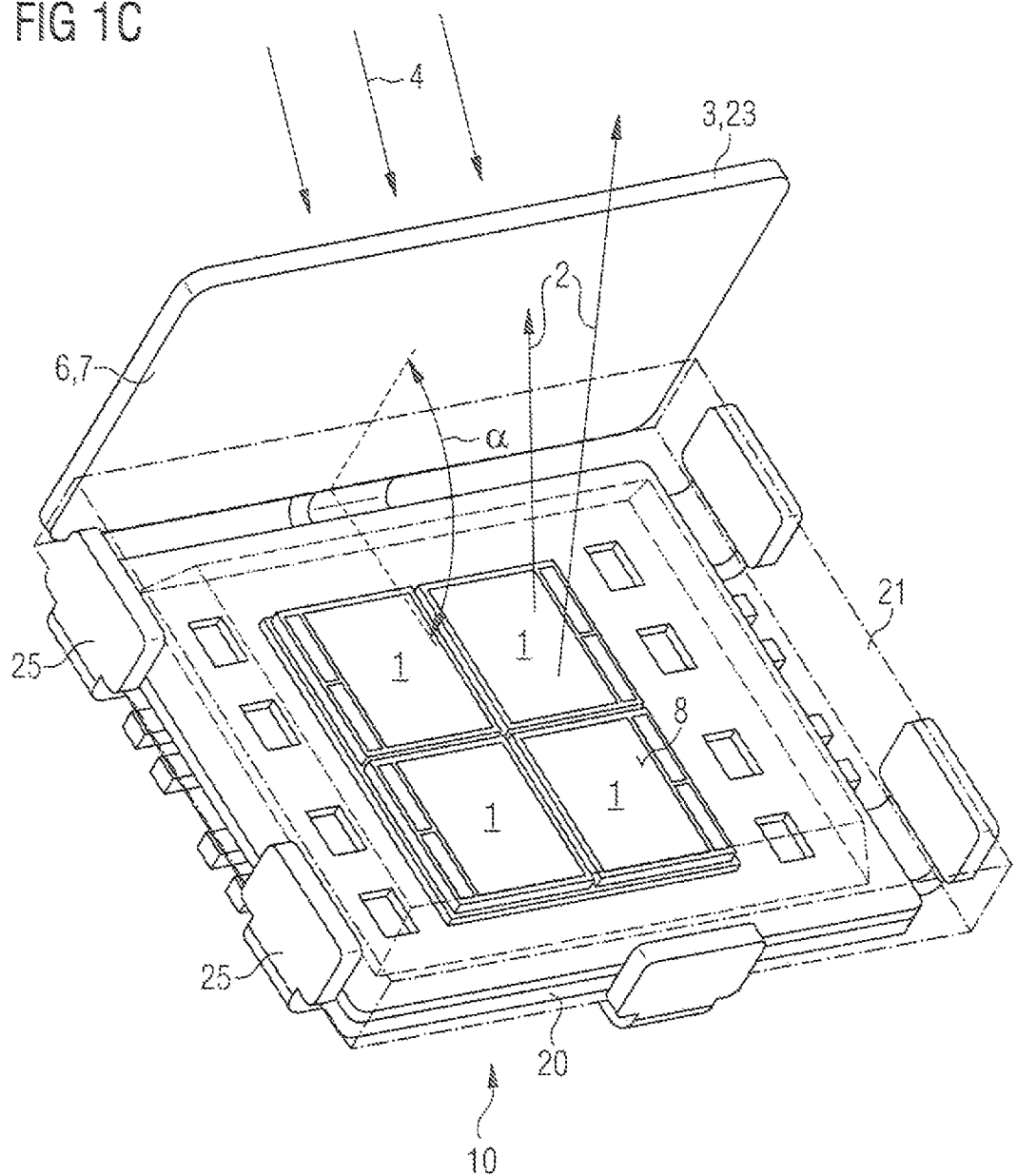

FIGS. 1A, 1B and 1C show a first example of an optoelectronic device described on the basis of schematic perspective illustrations. The optoelectronic device 10 has four luminescence diode chips 1 embodied as light-emitting diode chips. In this case, the four luminescence diode chips 1 can emit light having the same color or different colors. By way of example, one luminescence diode chip 1 is provided for generating blue light, one luminescence diode chip 1 is provided for generating red light, and two luminescence diode chips 1 are provided for generating green light.

The luminescence diode chips 1 are fixed on a connection carrier 20, which in the present case is embodied as a metallic leadframe. The luminescence diode chips 1 are surrounded by a potting 21.

The outer surface of the potting 21 which is remote from the luminescence diode chips 1 forms the radiation exit area 8 of the optoelectronic device 10.

The connection carrier 20 has lugs 25, in which it is bent up toward the potting 21. This increases the adhesion of the potting 21 to the remaining components of the optoelectronic device 10 such as the connection carrier 20 or the luminescence diode chips 1.

As an alternative to a potting 21, the luminescence diode chips 1 can also be covered by a glass plate. The glass plate then preferably has, on its side facing the luminescence diode chips 1, in the region of the luminescence diode chips 1, at least one recess in which it is reduced in terms of its thickness. The luminescence diode chips 1 are arranged in the recess. The recess can be produced by etching the glass plate for example.

The connection carrier 20 furthermore has a shielding region 23, with which the connection carrier 20 is embodied integrally. The shielding region 23 is, in principle, an enlarged lug 25 extending along a side area of the optoelectronic device 10. The shielding region 23 projects above the potting 21 at least above the height of the potting 21. The shielding region 23 laterally surrounds the luminescence diode chips 1 only in places. That is to say that the shielding region 23 is arranged laterally adjacent to a side area of the luminescence diode chip 1. The shielding region 23 does not completely surround the luminescence diode chips 1 laterally.

The shielding region 23 forms the sole shield 3 of the optoelectronic device against stray radiation 4 incident on the device 10 from outside. The shielding region 23 is connected to the rest of the connection carrier 20 by means of a bend 24. In the region of the bend 24, the connection carrier 20 is bent in such a way that the shielding region 23 forms an angle α of approximately 90° with the rest of the connection carrier 20.

The inner area of the shielding region 23 which faces the luminescence diode chip 1 can be embodied as a reflection region 6 and/or as an absorption region 7. That is to say that, as required, this area is embodied as absorbent or reflective for electromagnetic radiation 2 generated by the luminescent diode chips 1 during operation.

Preferably, in the example described in conjunction with FIGS. 1A, 1B and 1C, the connection carrier 20 is flexible in such a way that the user of the optoelectronic device can set the angle α by simple mechanical bending within a certain scope depending on the use of the optoelectronic device. The optoelectronic device can thus be adapted to its location of use in a simple manner.

A further example of an optoelectronic device 10 described is explained in greater detail in conjunction with FIGS. 2A and 2B. In this case, FIGS. 2A and 2B show schematic perspective illustrations of the optoelectronic device 10. The device 10 has a reflector wall 30. The reflector wall 30 has a non-uniform height. In its highest regions—the shielding region 33 of the reflector wall—the reflector wall 30 forms the shield 3. That is to say, that in this region the reflector wall shields the optical components of the optoelectronic device against stray radiation 4.

The reflector wall 30 is embodied as a reflection region 6 in the shielding region 33 at its side facing the luminescence diode chip 1, which reflection region reflects radiation 2 generated by the luminescence diode chip 1 during operation.

The reflector wall 30 can be applied to the carrier 32 as a separate component of the device. Furthermore, it is possible for reflector wall 30 and carrier 32 to be embodied integrally with one another and to be produced, for example, by a joint injection molding or a joint transfer molding method with one another. The carrier 32 can be, for example, the base body—embodied in an electrically insulating fashion—of the circuit board via which electrical contact is made with the luminescence diode chip 1.

The shielding region 33 is embodied integrally with the reflector wall 30 and is distinguished by the fact that it has a greater height H2 than the minimum height H1 of the reflector wall 30 (in this respect, also see FIG. 3A). The shield 3, that is to say the shielding region 33 of the reflector wall, has a curvature 5, which guides away rainwater, for example, which can fall from the same direction as the stray light 4, around the optical components of the optoelectronic device 10 toward the outside.

Instead of the reflector wall 30, however, the optoelectronic device 10 can also have an absorber wall 30, which absorbs electromagnetic radiation impinging on it. The absorber wall is embodied in a black fashion, for example. It can be coated in a black fashion—for example, with a colorant—or be formed from a black material—such as carbon black-filled plastic. The absorber wall suppresses the production of scattered radiation, for example. For example, the absorber wall has a reflectivity of preferably less than 10%, particularly preferably of less than 5%, for light impinging on it.

A further example of an optoelectronic device described is explained in greater detail in conjunction with FIGS. 3A and 3B. In a manner supplementing the optoelectronic device as explained in conjunction with FIGS. 2A and 2B, the optoelectronic device 10 here has a lens 31, which surrounds both the luminescence diode chip 1 and the reflector wall 30 with shielding region 33. In this case, the lens 31 spans the components of the device 10 in a dome-like manner. The lens 31 can be embodied as a hollow body, such that it is placed over reflector wall 30 and luminescence diode chip 1 in the manner of a cheese dome. Furthermore, it is possible for the lens 31 to be embodied as a solid body. The lens 31 can be applied as a type of potting over luminescence diode chip 1 and reflector wall 30, such that the reflector wall 30 and thus the shielding region 33 are embedded in the potting of the lens 31.

In conjunction with FIG. 3A it is once again illustrated that the reflector wall 30 has a minimum height H1 where it does not form a shielding region 33. It forms the shielding region 33 only in the region where the reflector wall 30 has a height greater than H1, with the maximum height H2. That is to say, that the shield formed by the shielding region 33 laterally surrounds the luminescence diode chip 1 only in places. By virtue of the fact that the reflector wall 30 has regions having a reduced height H1, the shield 3, that is to say, the shielding region 33, is not led completely around the luminescence diode chip 1. The reflector wall 30 is therefore embodied in an asymmetrical fashion.

Figure 4A:
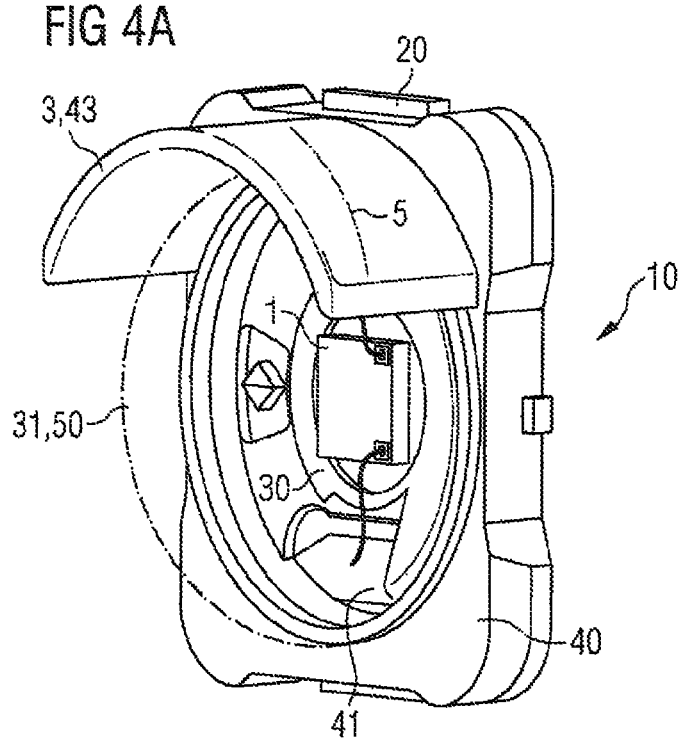
Figure 4B:
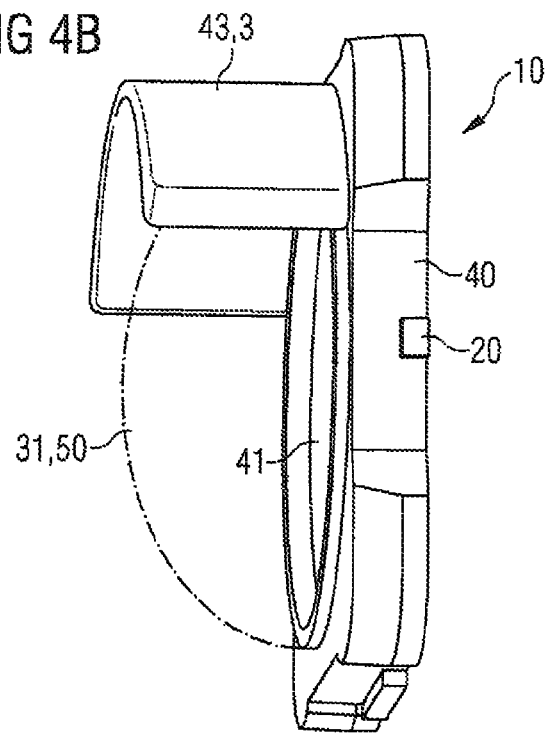

A further example of an optoelectronic device 10 described is explained in greater detail in conjunction with FIGS. 4A, 4B and 4C. In contrast to the example described in conjunction with FIGS. 3A and 3B, the shielding region 3 here is arranged outside the lens 31, 50. In this example, the optoelectronic device 10 comprises a housing base body 40, which surrounds a connection carrier 20. By way of example, the housing base body 40 is molded onto the connection carrier, which can be embodied as a carrier strip.

In other words, the material of the base body 40 is molded around the connection carrier 20. The base body 40 has a cavity 41, in which the luminescence diode chip 1 is arranged. A reflector wall 30 is arranged around the luminescence diode chip 1, which reflector wall in this case has a uniform height and does not comprise a shielding region 33. Rather, the housing base body 40 has a shielding region 43, with which it is embodied integrally. The shielding region 43 is embodied in a manner of a projection and, for example, transfer molded or injection molded together with the housing base body.

Alternatively, it is possible for the shielding region 43 to be fixed in the housing base body 40 by means of a pressfit. That is to say, that the shielding region 43 is in this case plugged into the housing base body 40, adhesively bonded thereto or fixed thereto in some other way. At all events, the shielding region 43 and, hence, the shield 3 surrounds the luminescence diode chip 1 laterally only in places. In this case, the shielding region is embodied with a height such that it is at least as high as the highest point of the lens 31, 50, or projects above the lens 31, 50. The shielding region 43 has a curvature 5, which is provided for guiding rainwater around the lens 31, 50 and, thus, around the radiation exit area 8 of the optoelectronic device.

A further example of an optoelectronic device described is explained in greater detail in conjunction with FIG. 5A on the basis of a perspective schematic plan view. In this example, the device has two different shields 3. First, the device has a shield 3 formed by a shielding region 43 of the base body 40, as described for example in conjunction with FIGS. 4A to 4C. Furthermore, the device 10 has a shield 3 formed by a shielding region 53 of the lens 50. In the shielding region 53, the lens is coated with a material at its outer surface and thereby embodied in an absorbent fashion. That is to say, that electromagnetic radiation 2 generated by the luminescence diode chip 1 during operation is absorbed by this region of the lens.

Likewise, radiation 4 which impinges on the lens from outside but which is not kept away by the shielding region 43 of the base body 40 is also absorbed. Furthermore, it is possible for the shielding region 53 of the lens to be embodied in polarizing or reflective fashion. The example described in conjunction with FIG. 5A is furthermore an example of the fact that the shields described for the optoelectronic device can be combined with one another in one and the same optoelectronic device 10. In this way, the advantages of the individual shields can be combined, thus resulting in particularly advantageous optoelectronic devices 10.

Finally, a further example of an optoelectronic device described is explained in conjunction with FIG. 5B. In contrast to the device described in conjunction with FIG. 5A, FIG. 5B shows a device wherein the shield 3 is formed only by a shielding region 53 of the lens 50.

This disclosure is not restricted to the examples by the description on the basis of those examples. Rather, the disclosure encompasses any novel feature and also any combination of features, which in particular includes any combination of features in the appended claims, even if this feature or this combination itself is not explicitly specified in the claims or examples.

The invention claimed is:

1. An optoelectronic device comprising:
    at least one luminescence diode chip which emits electromagnetic radiation during operation of the optoelectronic device,
    a reflector wall or absorber wall which laterally completely surrounds the at least one luminescence diode chip,
    a connection carrier on which the at least one luminescence diode chip is fixed at least indirectly and via which electrical contact is made with the at least one luminescence diode chip, and
    at least one shield that shields against stray radiation which laterally surrounds the luminescence diode chip only in places, wherein each shield is integral with a component of the optoelectronic device, the reflector wall or absorber wall has a non-uniform height (H), the at least one shield is formed, at least in places, by a shielding region of the reflector wall or absorber wall, the shielding region being higher than the rest of the reflector wall or absorber wall, the reflector wall or absorber wall is arranged within a lens for the at least one luminescence diode chip, the connection carrier is formed by a circuit board comprising an electrically insulating base body into which or onto which is structured at least one electrical connection location and/or at least one conductor track by which electrical contact is made with the at least one luminescence diode chip, and the reflector wall or absorber wall is integral with the insulating base body of the circuit board.

2. The optoelectronic device as claimed in claim 1, wherein the at least one shield is formed by a shielding region of the connection carrier at least in places.

3. The optoelectronic device as claimed in claim 2, wherein the connection carrier has a bend connecting the shielding region of the connection carrier to a remaining portion of the connection carrier.

4. The optoelectronic device as claimed in claim 2, wherein the shielding region and the rest of the connection carrier form an angle ($\alpha$) of less than or equal to 110° with one another.

5. The optoelectronic device as claimed in claim 1, wherein the reflector wall or absorber wall is in a potting for the at least one luminescence diode chip.

6. The optoelectronic device as claimed in claim 1, further comprising:

a housing base body having a cavity in which the at least one luminescence diode chip is arranged, wherein the at least one shield is formed by a shielding region of the housing base body at least in places.

7. The optoelectronic device as claimed in claim 6, wherein the shielding region is injection-molded or transfer-molded together with a remaining portion of the housing base body.

8. The optoelectronic device as claimed in claim 1, further comprising:

a lens for the at least one luminescence diode chip, wherein the at least one shield is formed by a shielding region of the lens at least in places.

9. The optoelectronic device as claimed in claim 8, wherein the lens is polarizing, absorbent and/or reflective in the shielding region.

10. The optoelectronic device as claimed in claim 1, wherein the shield, at least in a reflection region facing the at least one luminescence diode chip is reflective to electromagnetic radiation generated by the luminescence diode chip during operation of the optoelectronic device.

11. The optoelectronic device as claimed in claim 1, wherein the at least one shield, at least in an absorption region facing the at least one luminescence diode chip is absorbent to electromagnetic radiation generated by the luminescence diode chip during operation of the optoelectronic device.

12. The optoelectronic device as claimed in claim 1, wherein the at least one shield has a curvature.

13. The optoelectronic device as claimed in claim 12, wherein the shield diverts rainwater around a radiation exit area of the optoelectronic device.

14. The optoelectronic device as claimed in claim 3, wherein the shielding region and the rest of the connection carrier form an angle ($\alpha$) of less than or equal to 110° with one another.

15. The optoelectronic device as claimed in claim 1, wherein the reflector wall or absorber wall is in a potting for the at least one luminescence diode chip.

\* \* \* \* \*